(12) United States Patent
Fukui

(10) Patent No.: US 6,516,458 B1
(45) Date of Patent: Feb. 4, 2003

(54) LAYOUT STRUCTURE FOR INTEGRATED CIRCUIT, METHOD AND SYSTEM FOR GENERATING LAYOUT FOR CMOS CIRCUIT

(75) Inventor: Masahiro Fukui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 43 days.

(21) Appl. No.: 09/684,621

(22) Filed: Oct. 10, 2000

(30) Foreign Application Priority Data

Oct. 13, 1999 (JP) .......................................... 11-290873

(51) Int. Cl.[7] .............................................. G06F 17/50
(52) U.S. Cl. .............................................. 716/8; 716/7
(58) Field of Search ........................................ 716/1–18

(56) References Cited

U.S. PATENT DOCUMENTS

| | | | | |
|---|---|---|---|---|
| 4,651,190 A | * | 3/1987 | Suzuki | 257/206 |
| 4,742,471 A | * | 5/1988 | Yoffa et al. | 716/12 |
| 5,136,356 A | * | 8/1992 | Sakuda et al. | 257/211 |
| 5,313,079 A | * | 5/1994 | Brasen et al. | 257/206 |
| 5,341,041 A | * | 8/1994 | El Gamal | 326/44 |
| 5,532,934 A | * | 7/1996 | Rostoker | 716/10 |
| 5,701,255 A | | 12/1997 | Fukui | 364/491 |
| 5,923,569 A | * | 7/1999 | Kumashiro et al. | 716/7 |
| 6,166,560 A | | 12/2000 | Ogura et al. | 326/41 |

FOREIGN PATENT DOCUMENTS

| | | |
|---|---|---|
| JP | 7-74253 | 3/1995 |
| JP | 10-135431 | 5/1998 |

OTHER PUBLICATIONS

"CMOS VLSI Engineering Silicon–on–Insulator/SOI", J.B. Kuo et al., Kluwer Academic Publishers, Chapter 3, pp. 72–73.

* cited by examiner

Primary Examiner—Matthew Smith
Assistant Examiner—Sun James Lin
(74) Attorney, Agent, or Firm—McDermott, Will & Emery

(57) ABSTRACT

A layout structure and a method for generating a layout for an integrated circuit more efficiently to catch up with remarkable developments of fabrication technologies of today. In generating a layout for a CMOS circuit, a pair of p- and n-channel transistors is used as a layout unit if one of these transistors is the dual of the other. These two transistors of are placed closely to each other so that when wires are connected to the source or drain of the p-channel transistor and to the source or drain of the n-channel transistor, those wires can be extended substantially vertically to each other.

12 Claims, 10 Drawing Sheets

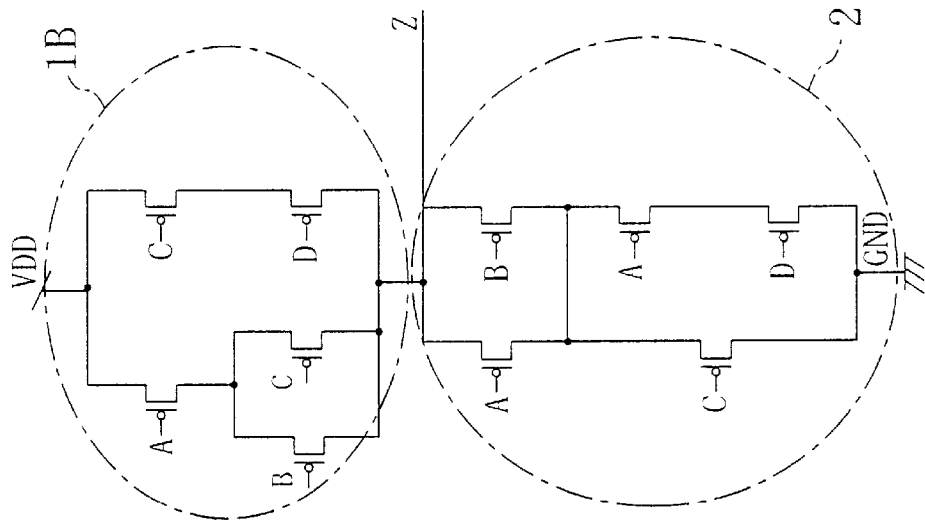

LAYOUT STRUCTURE FOR INTEGRATED CIRCUIT, METHOD AND SYSTEM FOR GENERATING LAYOUT FOR CMOS CIRCUIT

BACKGROUND OF THE INVENTION

The present invention relates to a technique of generating a physical layout for an integrated circuit being designed.

In the past, an integrated circuit was normally designed with respective regions where p- and n-channel transistors should be placed (which will be herein called "p- and n-channel transistor regions") separated from each other to satisfy a constraint involved with the actual fabrication process of the circuit. This is because a relatively wide isolation region had to be provided between p- and n-wells. In that case, the total area of circuit elements to be laid out could be rather small and the generation of a parasitic thyristor could also be avoided.

However, the isolation region between the p- an d n-wells tends to decrease its required area thanks to recent development of new well isolation techniques such as trench isolations. Also, since a substrate with low resistance is now available, the generation of the parasitic thyristor is avoidable even if no such isolation regions are provided. Furthermore, as for a transistor with a silicon-on-insulator (SOI) structure, the doped regions of the transistor function as isolation regions by themselves and yet the parasitic thyristor can be eliminated, too.

Considering these developments of the fabrication technologies, the conventional layout that provides the isolation region between the p- and n-channel transistor regions now might have some downsides. For example, the wires might be overly complicated or the occupied areas and delays caused might both be greater than a layout without the isolation region. Accordingly, a layout, in which p- and n-channel transistors are both placed in a single region, would be preferred to reduce the area required.

Nevertheless, almost no such layout structures or methods have been proposed yet. For example, James B. Kuo and Ker-Wei Su disclosed an exemplary layout for an inverter with an SOI structure (see "CMOS VLSI Engineering Silicon-on-Insulator (SOI)", Chapter 3, p. 72, Kluwer Academic Publishers). However, no one has ever reported any structure or method for generating a physical layout for a general-purpose circuit efficiently by taking advantage of the features of the SOI structure.

SUMMARY OF THE INVENTION

It is therefore an object of the present invention to provide structure and method for obtaining a layout more efficiently by making full use of the recent developments of fabrication technologies.

In a CMOS circuit, a switching circuit made up of p-channel transistors and a switching circuit made up of n-channel transistors (which will be herein called "p- and n-channel transistor circuits", respectively) perform binary operations in such a manner that one of these two circuits is the dual of the other. Accordingly, in designing a layout structure for the CMOS circuit, the p- and n-channel transistor circuits may be represented as dual transistor connection structures (i.e., graphic structures) and a resultant dual graph may be drawn on a graphic plane. In this manner, a best layout structure with simplified wires can be obtained. And this is the basic concept of the present invention.

Specifically, an inventive layout structure for an integrated circuit includes a pair of p- and n-channel transistors placed closely to each other. As the structure is viewed from above, a direction in which a wire connected to the source or drain of the p-channel transistor extends is substantially vertical to a direction in which a wire connected to the source or drain of the n-channel transistor extends.

According to the present invention, a physical layout for an integrated circuit being designed can be obtained efficiently. In addition, wires can be placed in a single interconnection layer over the transistors without having the wires make any unwanted detour.

Another inventive layout structure for an integrated circuit includes a pair of p- and n-channel transistors placed closely to each other. The transistors in the pair are placed so that when wires are connected to the source or drain of the p-channel transistor and to the source or drain of the n-channel transistor, respectively, the wires can be extended substantially vertically to each other as the structure is viewed from above.

According to the present invention, a physical layout for an integrated circuit being designed can be obtained efficiently. In addition, wires can be placed in a single interconnection layer over the transistors without having the wires make any unwanted detour.

Still another inventive layout structure for an integrated circuit includes a pair of p- and n-channel transistors placed closely to each other. The pair of transistors includes five terminals. And one of the five terminals is a gate terminal connected to the respective gates of the p- and n-channel transistors.

Thus, the present invention provides a structure effectively applicable to a basic cell for a gate array.

An inventive method for generating a layout for a CMOS circuit being designed includes the steps of: selecting a pair of p- and n-channel transistors out of multiple transistors of the CMOS circuit and regarding the pair of transistors as a layout unit, where one of the p- and n-channel transistors in the pair is the dual of the other; and placing the pair of transistors so that the transistors are located closely to each other and that when wires are connected to the source or drain of the p-channel transistor and to the source or drain of the n-channel transistor, respectively, the wires can be extended substantially vertically to each other as the structure is viewed from above.

An inventive system for generating a layout for a CMOS circuit being designed includes: means for plotting planar graphs for a circuit made up of p-channel transistors and a circuit made up of n-channel transistors, the two circuits together making the CMOS circuit; means for grouping the p- and n-channel transistors, included in these two circuits, into multiple pairs of p- and n-channel transistors using the planar graphs so that each said pair of transistors is used as a layout unit and that one of the transistors in each said pair is the dual of the other; means for initially placing each said pair of p- and n-channel transistors to meet a relative positional relationship as defined by the planar graphs so that the p- and n-channel transistors are located closely to each other and that when wires are connected to the source or drain of the p-channel transistor and to the source or drain of the n-channel transistor, respectively, the wires can be extended substantially vertically to each other as the structure is viewed from above; means for optimizing the placement of each said pair of transistors so that an overlap between the p- and n-channel transistors is eliminated and that the p- and n-channel transistors connected together are even closer to each other; and means for interconnecting together terminals of the pairs of transistors placed.

Another inventive system for generating a layout for a CMOS circuit being designed uses a gate array, in which multiple basic cells are arranged in columns and rows. Each said basic cell includes a pair of p- and n-channel transistors placed closely to each other so that when wires are connected to the source or drain of the p-channel transistor and to the source or drain of the n-channel transistor, respectively, the wires can be extended substantially vertically to each other as the structure is viewed from above. The system includes: means for plotting planar graphs for a circuit made up of p-channel transistors and a circuit made up of n-channel transistors, the two circuits together making the CMOS circuit; means for grouping the p- and n-channel transistors, included in these two circuits, into multiple pairs of p- and n-channel transistors using the planar graphs so that each said pair of transistors is used as a layout unit and that one of the transistors in each said pair is the dual of the other; means for initially assigning each said pair of p- and n-channel transistors to associated one of the basic cells in the gate array to meet a relative positional relationship as defined by the planar graphs; means for optimizing the assignment of the pairs of transistors according to an index such as area or total wire length; and means for interconnecting together terminals of the pairs of transistors placed.

BRIEF DESCRIPTION OF THE DRAWINGS

FIGS. 1(a) and 1(b) illustrate two exemplary circuit configurations for a CMOS circuit.

DESCRIPTION OF THE PREFERRED EMBODIMENTS

FIGS. 1(a) and 1(b) illustrate two exemplary circuit configurations for a CMOS circuit, which is an exemplary integrated circuit according to the present invention. As shown in FIGS. 1(a) and 1(b), the CMOS circuit includes a p-channel transistor circuit 1A or 1B and an n-channel transistor circuit 2. The CMOS circuit is a circuit of which the p- and n-channel transistor circuits 1A or 1B and 2 operate complementarily. Specifically, while one of the p- and n-channel transistor circuits 1A, 1B or 2 is conducting, the other circuit 1A, 1B or 2 is always non-conducting. And while one of the p- and n-channel transistor circuits 1A, 1B or 2 is non-conducting, the other circuit 1A, 1B or 2 is always conducting.

Although the CMOS circuits shown in FIGS. 1(a) and 1(b) have mutually different structures, the operations of these circuits are both given by the following equation:

$$Z = A*B + C*(A+D) = A(B+C) + C*D$$

In the CMOS circuit shown in FIG. 1(a), the connectivity of the p- and n-channel transistor circuits 1A and 2 meets a dual relation. In that case, the connectivity of the p- and n-channel transistor circuits 1A and 2 can be represented as a dual graph. That is to say, a planar graph representing the connectivity information of one of these two circuits can be obtained from a planar graph representing the connectivity information of the other circuit.

As used herein, the "planar graph" refers to a graph that has been plotted on a plane so that no branches of the graph intersect with each other. Every binary circuit can be represented as a planar graph meeting the operating description thereof. However, not every CMOS circuit can be represented as a planar graph.

A dual graph representing the connectivity will be described with reference to FIGS. 2(a), 2(b) and 2(c). In the following example, a planar graph is supposed to be obtained for the circuit shown in FIG. 1(a). To illustrate the duality of connection structures more understandably, the planar graph representing the connectivity information of the p-channel transistor circuit 1A will be labeled as graph A, while the planar graph representing the connectivity information of the n-channel transistor circuit 2 will be labeled as graph B. In these graphs, each point will be called a "node" and each line will be called a "branch". Also, a closed planar area enclosed with multiple branches will be called a "face".

Figure 2A:
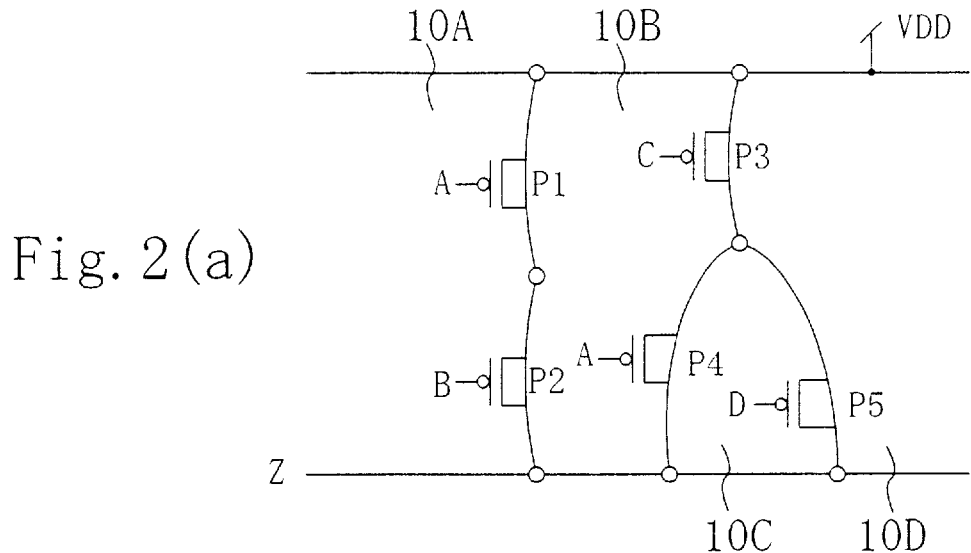
FIGS. 2(a) through 2(c) illustrate how a dual graph representing connectivity can be obtained.

FIG. 2(a) illustrates the planar graph A representing the connectivity information of the p-channel transistor circuit 1A. As shown in FIG. 2(a), when the graph A is plotted as a planar graph, the plane is divided by the branches of the graph A into a plurality of faces 10A, 10B, 10C and 10D.

Figure 2B:
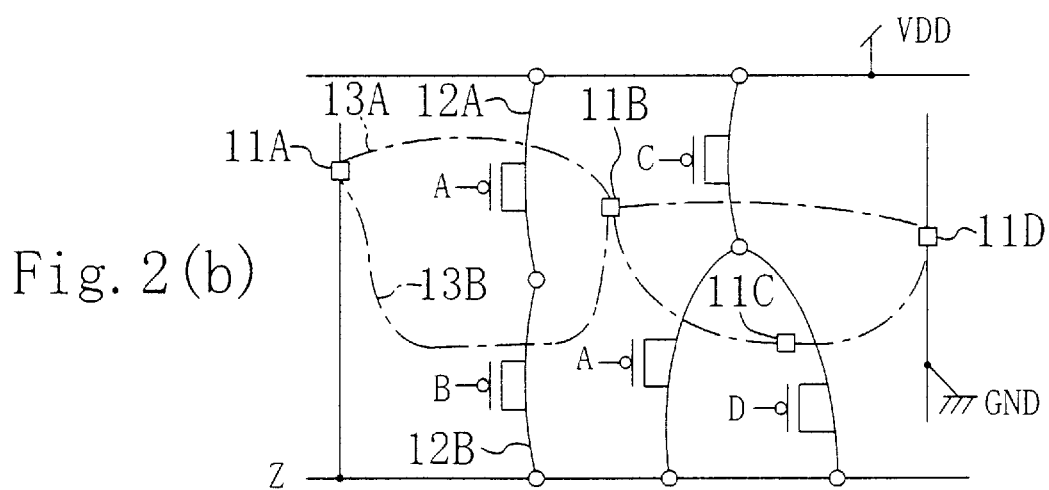

Next, as shown in FIG. 2(b), the nodes 11A, 11B, 11C and 11D of the graph B are placed over the respective faces 10A, 10B, 10C and 10D of the graph A. And the branches of the graph B are drawn between the nodes of the graph B so that each branch drawn for the graph B is associated with one of the branches of the graph A. For example, branches 13A and 13B for the graph B are drawn between the nodes 11A and 11B of the graph B so as to correspond to the two branches 12A and 12B of the graph A, respectively. Similar processing will be performed for each of the other pairs of nodes.

Figure 2C:
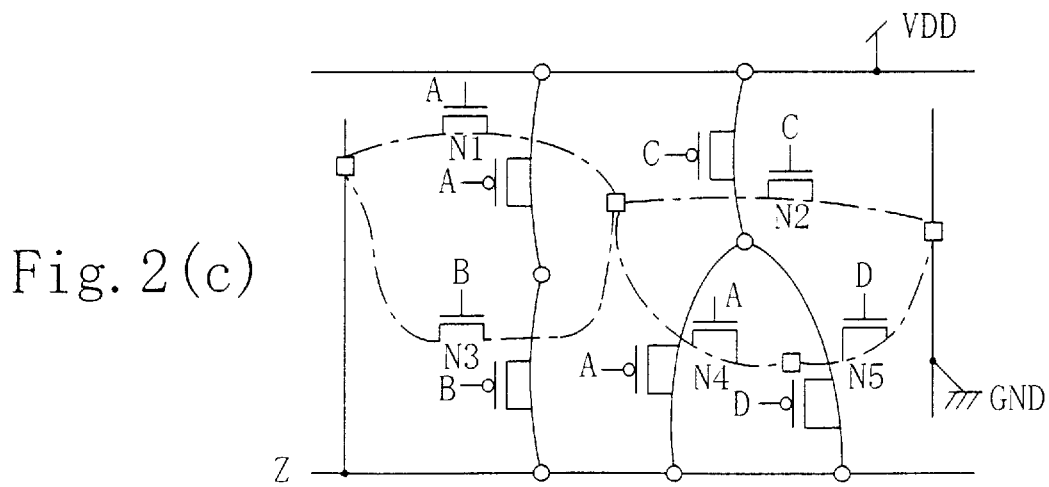

As a result, the graph B representing the connectivity information of the n-channel transistor circuit 2 can be obtained as indicated by the one-dot chains in FIG. 2(c). In this manner, every time a planar graph for a p-channel transistor circuit of a CMOS circuit is given, a planar graph representing the structure of an n-channel transistor circuit, which is the dual of the p-channel transistor circuit, can be obtained.

Figure 3:
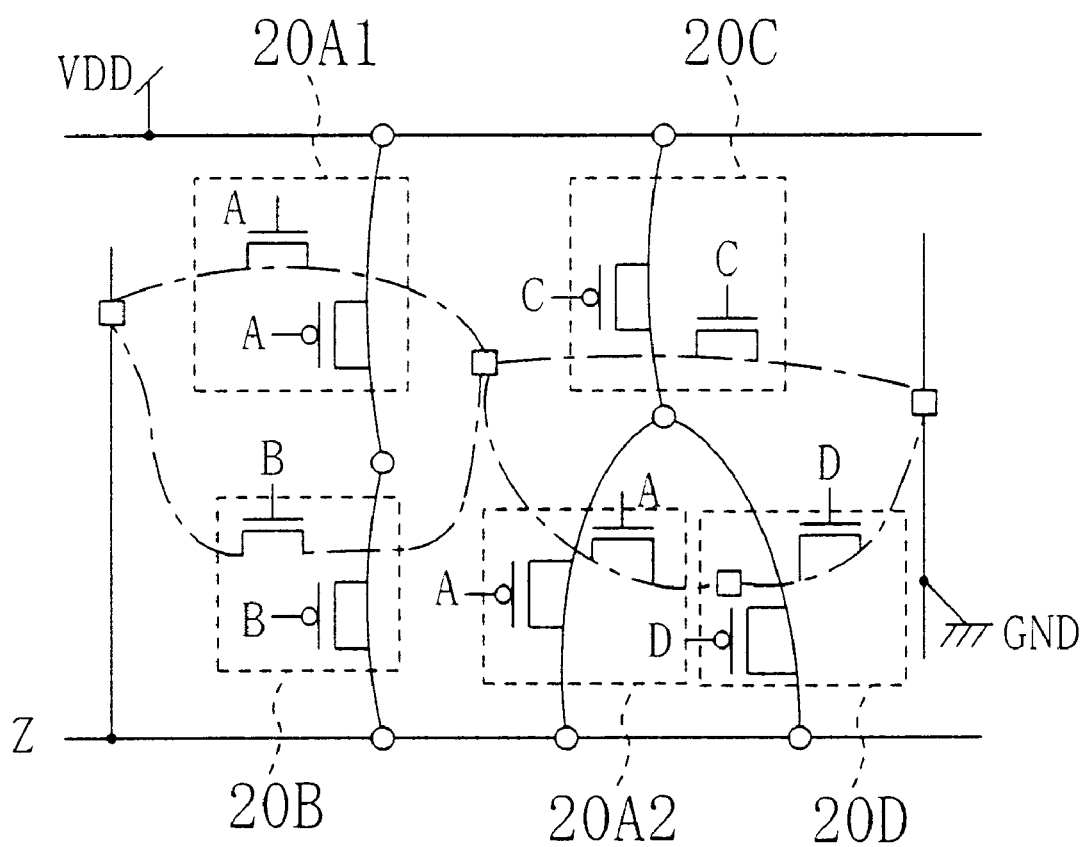
FIG. 3 is a dual graph illustrating multiple pairs of transistors.

FIG. 3 illustrates multiple pairs of transistors formed according to the dual graph shown in FIG. 2(c). In this case, transistors in each pair are associated with each other. As shown in FIG. 3, transistors P1 and N1 together form a pair 20A1 of transistors. Transistors P2 and N3 together form another pair 20B of transistors. Transistors P3 and N2 together form still another pair 20C of transistors. Transistors P4 and N4 together form yet another pair 20A2 of transistors. And transistors P5 and N5 together form yet another pair 20D of transistors.

If the p- and n-channel transistors in each of these pairs of transistors shown in FIG. 3 are placed closely to each other, then the wires, interconnecting these pairs of transistors together, can be placed in a single interconnection layer as can be seen from FIG. 3. The basic idea of the present invention was obtained from these findings.

That is to say, according to the present invention, the p- and n-channel transistor circuits of the CMOS circuit are represented as respective planar graphs and each dual pair of p- and n-channel transistors is regarded as a layout unit. And these pairs of transistors are placed so that the p- and n-channel transistors in each pair are closely located to each other and that when wires are connected to the source or drain of the p-channel transistor and to the source or drain of the n-channel transistor, respectively, the wires can be extended substantially vertically to each other. By adopting placement like this, multiple pairs of transistors can be connected together using a single interconnection layer.

Figure 4:
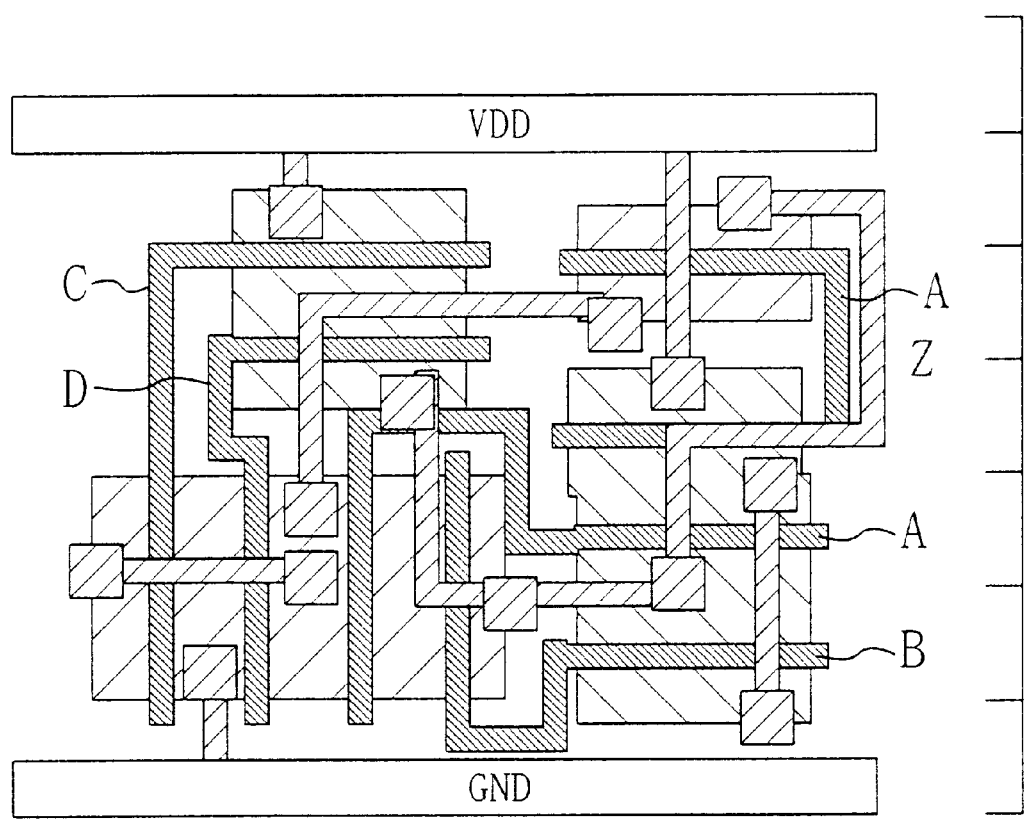
FIG. 4 illustrates a layout design obtained by an embodiment of the present invention using the dual graph shown in FIG. 3.

FIG. 4 illustrates a layout design, in which the p- and n-channel transistor regions are not separated from each other, according to the dual graph shown in FIG. 3. On the other hand, FIG. 5 illustrates a layout design obtained by a known placement/routing process as a comparative example.

In a CMOS circuit of the past, an isolation region had to be provided between p- and n-channel regions because of various constraints involved with the known fabrication process. For that reason, the p- and n-channel transistor regions used to be separated from each other and formed in a band shape as shown in FIG. 5.

Figure 5:
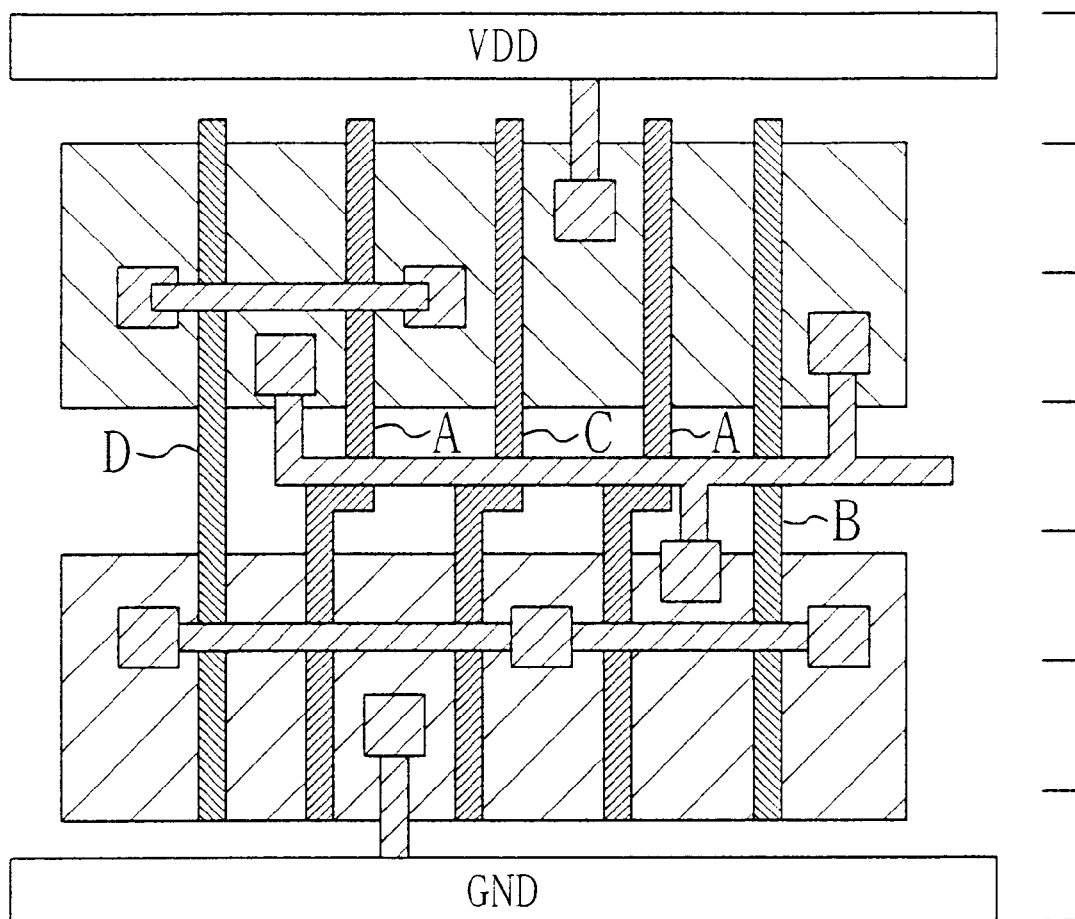
FIG. 5 illustrates a layout design obtained by a known placement/routing process.

The total area required by the layout shown in FIG. 4 is smaller than that required by the layout shown in FIG. 5 by about 10 percent. However, as for the example illustrated in FIG. 4, the gates, metal wires and so on cannot be said as simple as they can be. Also, the conventional layout is more advantageous than the inventive layout in that the area can be reduced by sharing a diffused region. Nevertheless, the number of constraints imposed on the locations of transistors is smaller in the present invention than in the prior art. Thus, the total area is potentially further reducible according to the present invention. For that reason, the present invention is particularly effectively applicable to a cell structure, like a gate array, in which diffused regions to be shared cannot be located in advance.

Figure 6A:
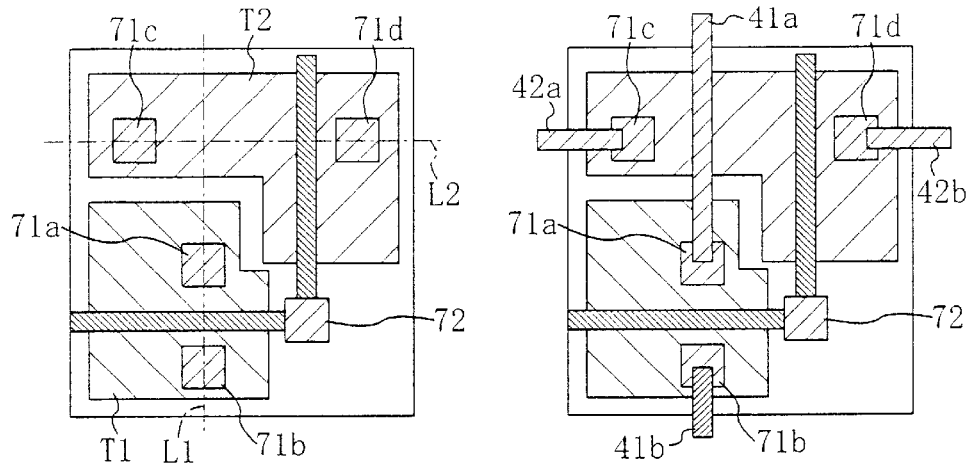
FIGS. 6(a) through 6(c) illustrate exemplary basic layouts for a pair of transistors along with layouts including upper-level wires according to an embodiment of the present invention.
Figure 6B:
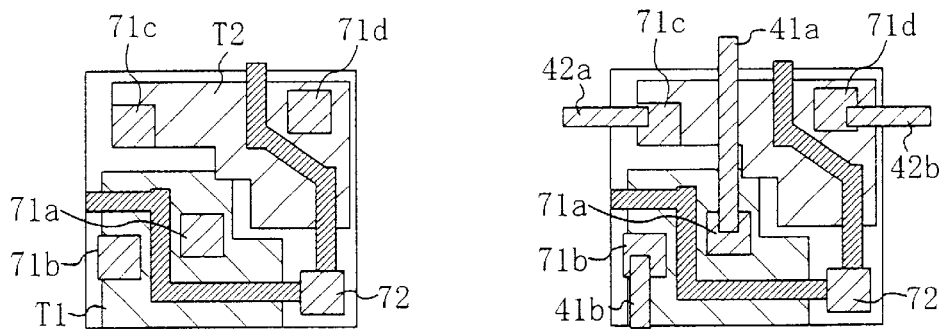
Figure 6C:
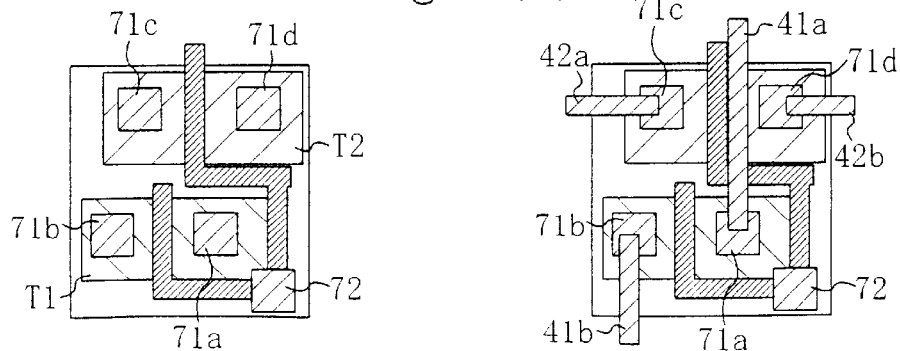

FIGS. 6(*a*) through 6(*c*) illustrate exemplary basic layouts for a pair of transistors according to an embodiment of the present invention. In the layout shown in FIG. 6(*a*), a line L1, which connects together the source, gate and drain of a p-channel transistor T1, crosses a line L2, which connects together the source, gate and drain of an n-channel transistor T2, at right angles. Accordingly, the direction in which the upper-level wires 41*a* and 41*b* connected to the source/drain of the p-channel transistor T1 extend can be vertical to the direction in which the upper-level wires 42*a* and 42*b* connected to the source/drain of the n-channel transistor T2 extend. As used herein, the notation "source/drain" means either the source and drain terminals or the drain and source terminals, because these terminals are usually usable interchangeably.

Also, this pair of transistors includes five terminals 71*a*, 71*b*, 71*c*, 71*d* and 72. The gate terminal 72 is connected to both of the gates of the p- and n-channel transistors T1 and T2.

The layouts shown in FIGS. 6(*b*) and 6(*c*) are obtained by compacting the layout shown in FIG. 6(*a*). In both of these layouts shown in FIGS. 6(*b*) and 6(*c*), the wires connected to the source/drain of the p-channel transistor T1 and the wires connected to the source/drain of the n-channel transistor T2 can be extended substantially vertically to each other. Also, to further reduce the total area, the region in which this pair of transistors is placed has been shaped into an almost square region.

Furthermore, by preparing a master slice for a gate array in which multiple basic cells, each having the layout shown in FIG. 6(*a*), 6(*b*) or 6(*c*), are arranged in columns and rows, a layout for a CMOS circuit can be easily mapped to an LSI according to the planar graph shown in FIG. 3.

Figure 7A:
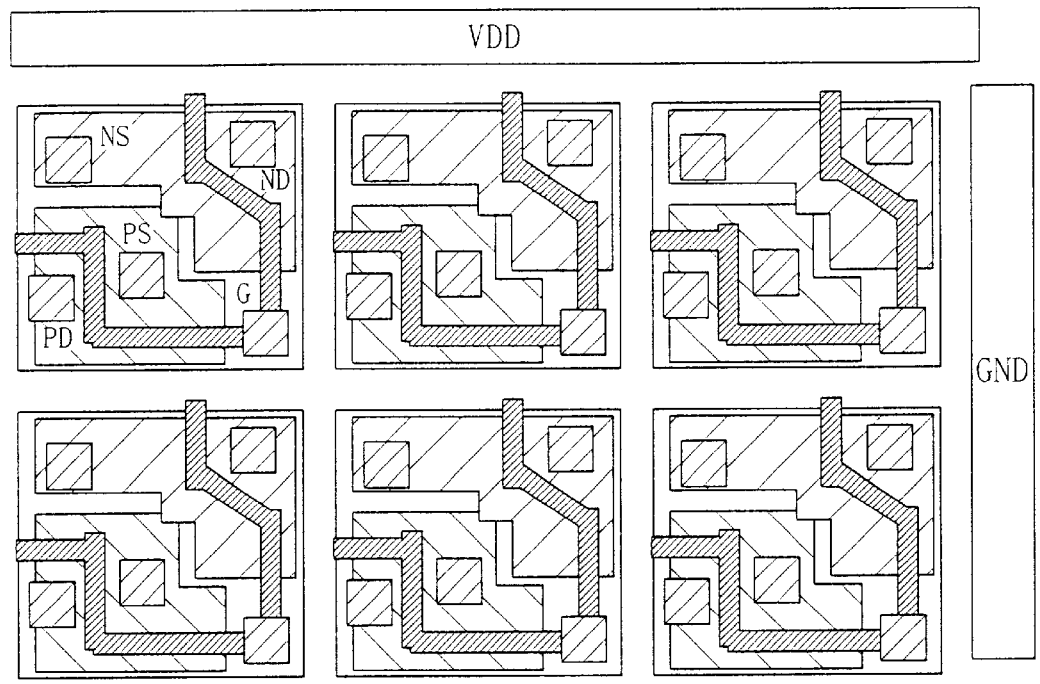
FIGS. 7(a) and 7(b) illustrate a master slice for a gate array according to the embodiment shown in FIG. 6(b).
Figure 7B:
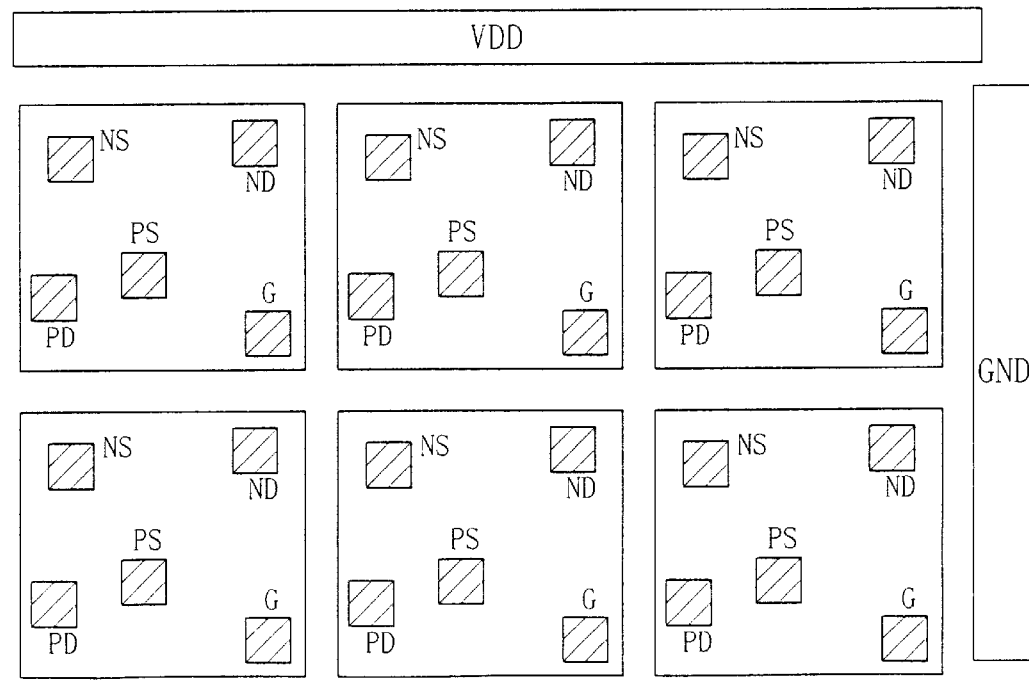

FIGS. 7(*a*) and 7(*b*) illustrate a master slice for a gate array according to this embodiment. Specifically, FIG. 7(*a*) illustrates a master slice for a gate array in which multiple basic cells, each having the layout shown in FIG. 6(*b*), are arranged in columns and rows. On the other hand, FIG. 7(*b*) illustrates a symbolic layout of the master slice shown in FIG. 7(*a*) for use in a placement/routing process.

Figure 8:
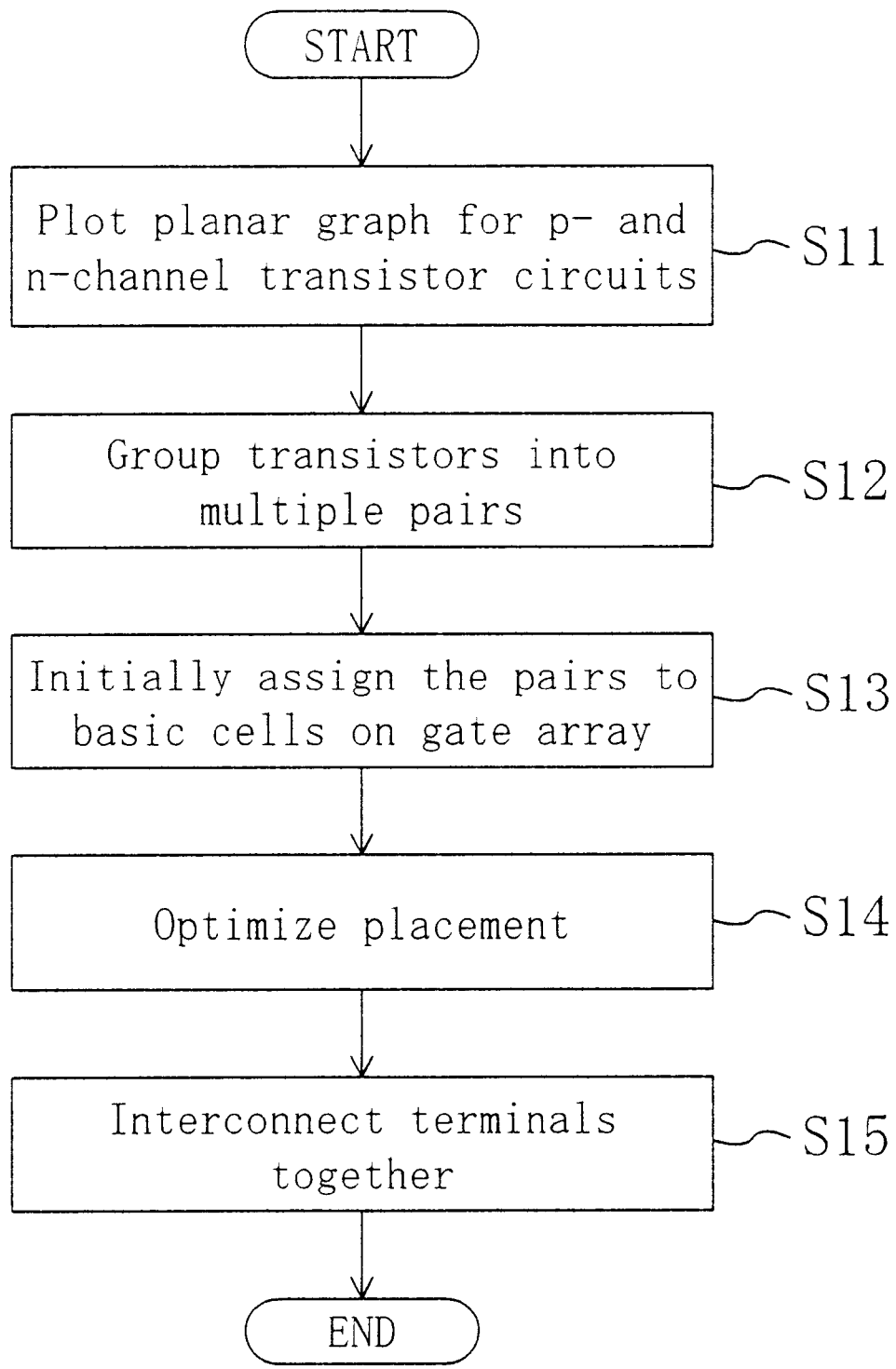
FIG. 8 is a flowchart illustrating a physical design method according to the illustrative embodiment of the present invention.

FIG. 8 is a flowchart illustrating a physical design process of a CMOS circuit according to the illustrative embodiment of the present invention. In the illustrated embodiment, a master slice for a gate array such as that shown in FIG. 7 has already been prepared.

Figure 9:
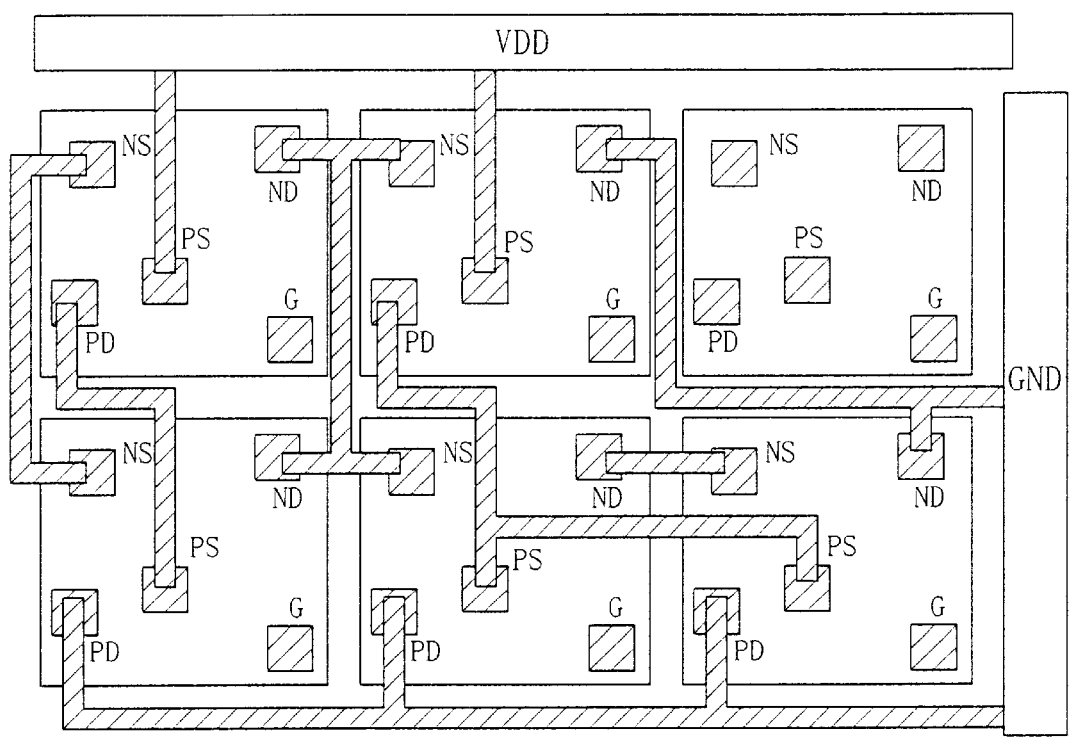
FIG. 9 illustrates an exemplary layout design obtained by the physical design method according to the embodiment of the present invention.

Suppose a layout should be generated for the CMOS circuit shown in FIG. 1(*a*). In this case, first, in Step S11, a planar graph for the p- and n-channel transistor circuits such as that shown in FIG. 3 is obtained. Next, in Step S12, the p- and n-channel transistors, included in the p- and n-channel transistor circuits, are grouped into multiple pairs of transistors so that one of the two transistors in each pair will be the dual of the other. Then, in Step S13, these pairs of transistors are initially assigned to respective basic cells on the gate array in accordance with the relative positional relationship as defined by the planar graph. Subsequently, in Step S14, the placement is optimized if necessary. For example, a circuit element once placed is moved to a different location or the location of the circuit element is exchanged for that of another. In this process step, various indices such as total area and total length are defined to optimize the placement and the placement is optimized in such a manner as to adjust the estimates to these indices. Finally, in Step S15, the terminals of those pairs of transistors placed are interconnected together. In this process step, the paths between the terminals should be found along the branches of the planar graph. FIG. 9 illustrates an exemplary layout design obtained by this routing process.

When the gate array arrangement is not used, a physical design process may be performed in the following manner. In that case, no master slice for a gate array has been prepared. Accordingly, after the transistors have been grouped into multiple pairs of transistors in Step S12, those pairs of transistors are initially placed in Step S13 using a pair of transistors as a layout unit according to the relative positional relationship as defined by the planar graph. However, an overlap between a pair of transistors is allowed in this case. Next, in Step S14, repulsion and attraction are defined as virtual forces for a pair of overlapping transistors and for a pair of separated transistors, respectively, and the placement is optimized according to these virtual forces. Finally, in Step S15, the terminals of those pairs of transistors placed are interconnected together.

Figure 10:
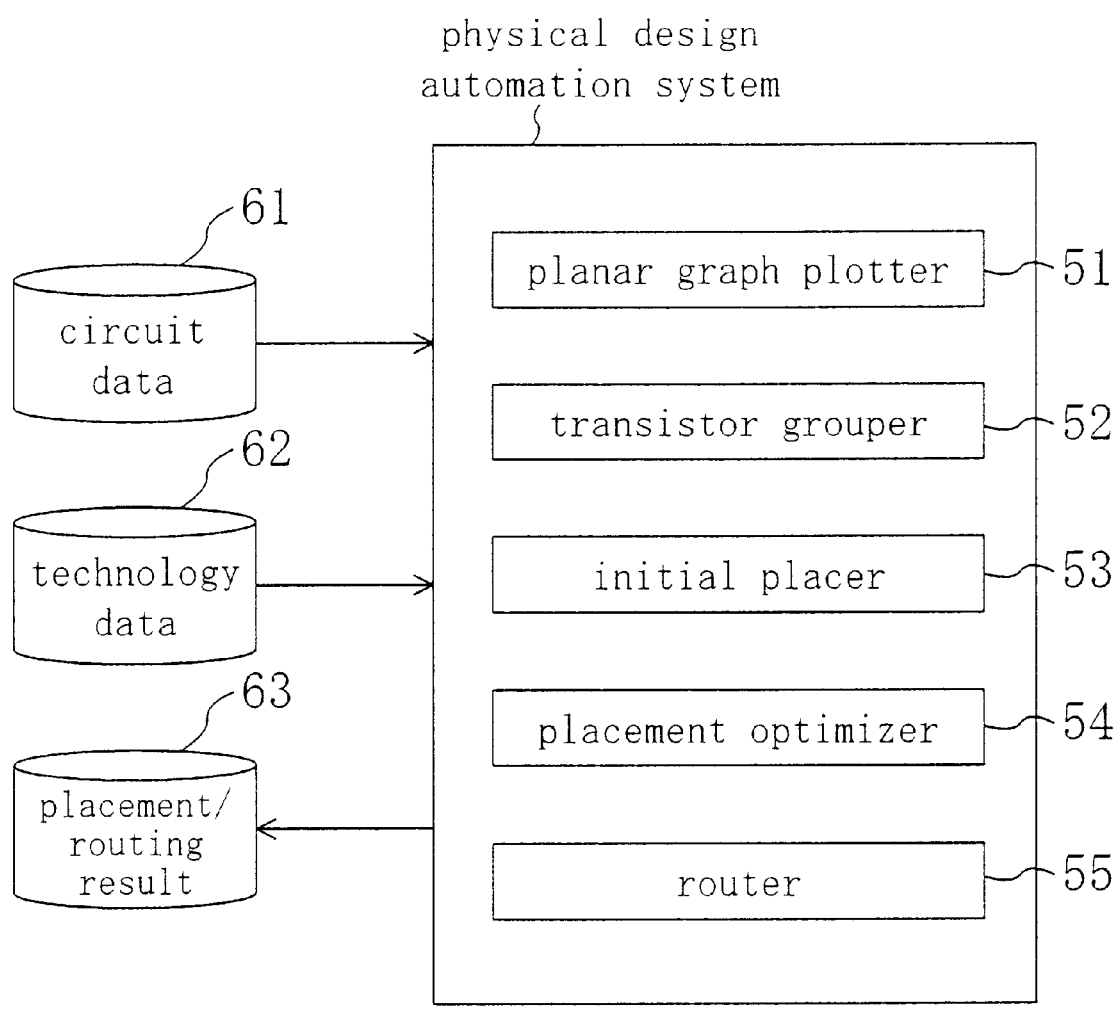
FIG. 10 is a block diagram illustrating an exemplary arrangement of a physical design automation system according to the embodiment of the present invention.

FIG. 10 is a block diagram illustrating an arrangement of a physical design automation system, which is an exemplary system for generating a layout according to an embodiment of the present invention. In practice, the physical design automation system shown in FIG. 10 is implemented as a combination of a computer system and software programs. Specifically, the system shown in FIG. 10 includes planar graph plotter 51, transistor grouper 52, initial placer 53, placement optimizer 54 and router 55, which correspond to the respective process steps S11, S12, S13, S14 and S15 shown in FIG. 8. Using circuit data 61 and technology data 63, which provides information about the basic cell of a gate array, design rules or gate array chip, the system performs the physical design process according to this embodiment to obtain a placement/routing result 63.

As is apparent from the foregoing description, according to the present invention, a layout for an integrated circuit can be obtained very efficiently with the total area of the circuit reduced. Accordingly, the present invention greatly contributes to cost reduction and performance enhancement of an integrated circuit, thus attaining noticeable industrial effects.

What is claimed is:

1. A layout structure for an integrated circuit, the structure comprising:

a plurality of pairs of transistors, each pair of transistors comprising a p-channel transistor and a n-channel transistor placed closely to each other, each pair of transistors being substantially square in structure, wherein in each pair of transistors, a first wire is connected to the source or drain of the p-channel transistor and a second wire is connected to the source or drain of the n-channel transistor, the first and second wires being formed in the same interconnection layer, and wherein as each pair of transistors is viewed from above, a direction in which the first wire extends is substantially perpendicular to a direction in which the second wire extends.

2. The structure of claim 1, wherein the pair of transistors comprises five terminals, and wherein one of the five terminals is a gate terminal connected to the respective gates of the p- and n-channel transistors.

3. The structure of claim 1, further comprising multiple other pairs of p- and n-channel transistors that are placed just like the pair of transistors, wherein all of these pairs of transistors are arranged to form an array.

4. A layout structure for an integrated circuit, the structure comprising:

a plurality of pairs of transistors, each pair of transistors comprising a p-channel transistor and a n-channel transistor placed closely to each other, each pair of transistors being substantially square in structure, wherein each pair of transistors is placed so that when wires are connected to the source or drain of the p-channel transistor and to the source or drain of the n-channel transistor, respectively, the wires can be extended substantially perpendicular to each other in the same interconnection layer when the pair of transistors is viewed from above.

5. The structure of claim 4, further comprising multiple other pairs of p- and n-channel transistors that are placed just like the pair of transistors, wherein all of these pairs of transistors are arranged to form an array.

6. A layout structure for an integrated circuit, the structure comprising:

a plurality of pairs of transistors connected together using a single interconnection layer, each pair of transistors comprising a p-channel transistor and a n-channel transistor placed closely to each other, each pair of transistors being substantially square in structure, wherein each pair of transistors includes five terminals, and wherein one of the five terminals is a gate terminal connected to the respective gates of the p-channel transistor and the n-channel transistor.

7. The structure of claim 6, further comprising multiple other pairs of p- and n-channel transistors that are placed just like the pair of transistors, wherein all of these pairs of transistors are arranged to form an array.

8. A method for generating a layout for a CMOS circuit being designed, the method comprising the steps of:

selecting a plurality of pairs of p-channel transistor and a n-channel transistor out of multiple transistors of the CMOS circuit and regarding each of the pairs of transistors as a layout unit, where one of the p- and n-channel transistors in the pair is the dual of the other; and placing each pair so that the p- and n-channel transistors are located closely to each other and that when wires are connected to the source or drain of the p-channel transistor and to the source or drain of the n-channel transistor, respectively, the wires can be extended substantially perpendicular to each other in the same interconnection layer when the pair is viewed from above, each pair of transistors being substantially square in structure.

9. The method of claim 8, further comprising the step of preparing a gate array, in which multiple basic cells are arranged in columns and rows, each said basic cell including the pair of transistors placed closely to each other so that when the wires are connected to the source or drain of the p-channel transistor and to the source or drain of the n-channel transistor, respectively, the wires can be extended substantially vertically to each other as the structure is viewed from above, wherein the p- and n-channel transistors of the pair are assigned to the p- and n-channel transistors of each said basic cell.

10. The method of claim 8, wherein the selecting step comprises the steps of:

plotting planar graphs for a circuit made up of p-channel transistors and a circuit made up of n-channel transistors, the two circuits together making the CMOS circuit; and grouping the p- and n-channel transistors, included in these two circuits, into multiple pairs of p- and n-channel transistors using the planar graphs so that one of the transistors in each said pair is the dual of the other.

11. A system for generating a layout for a CMOS circuit being designed, the system comprising:

means for plotting planar graphs for a circuit made up of p-channel transistors and a circuit made up of n-channel transistors, the two circuits together making the CMOS circuit;

means for grouping the p- and n-channel transistors, included in these two circuits, into multiple pairs of p- and n-channel transistors using the planar graphs so that each said pair of transistors is used as a layout unit and that one of the transistors in each said pair is the dual of the other;

means for initially placing each said pair of p- and n-channel transistors to meet a relative positional relationship as defined by the planar graphs so that the p- and n-channel transistors are located closely to each other and that when wires are connected to the source or drain of the p-channel transistor and to the source or drain of the n-channel transistor, respectively, the wires can be extended substantially vertically to each other as the structure is viewed from above;

means for optimizing the placement of each said pair of transistors so that an overlap between the p- and n-channel transistors is eliminated and that the p- and n-channel transistors connected together are even closer to each other; and means for interconnecting together terminals of the pairs of transistors placed.

12. A system for generating a layout for a CMOS circuit being designed using a gate array, in which multiple basic cells are arranged in columns and rows, each said basic cell including a pair of p- and n-channel transistors placed closely to each other so that when wires are connected to the source or drain of the p-channel transistor and to the source or drain of the n-channel transistor, respectively, the wires can be extended substantially vertically to each other as the structure is viewed from above, the system comprising:

means for plotting planar graphs for a circuit made up of p-channel transistors and a circuit made up of n-channel transistors, the two circuits together making the CMOS circuit;

means for grouping the p- and n-channel transistors, included in these two circuits, into multiple pairs of p- and n-channel transistors using the planar graphs so that each said pair of transistors is used as a layout unit and that one of the transistors in each said pair is the dual of the other;

means for initially assigning each said pair of p- and n-channel transistors to associated one of the basic cells in the gate array to meet a relative positional relationship as defined by the planar graphs;

means for optimizing the assignment of the pairs of transistors according to an index such as area or total wire length; and means for interconnecting together terminals of the pairs of transistors placed.

* * * * *